(12) United States Patent
Shtraikh et al.

(10) Patent No.: US 8,751,988 B1
(45) Date of Patent: Jun. 10, 2014

(54) COMPUTER-IMPLEMENTED METHODS AND SYSTEMS FOR AUTOMATIC GENERATION OF LAYOUT VERSUS SCHEMATIC (LVS) RULE FILES AND REGRESSION TEST DATA SUITES

(71) Applicant: Advanced Micro Devices, Inc., Sunnyvale, CA (US)

(72) Inventors: Vladimir V. Shtraikh, Austin, TX (US); James M. Hiatt, Wimberly, TX (US); James C. Pattison, Round Rock, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 13/717,118

(22) Filed: Dec. 17, 2012

(51) Int. Cl.
*G06F 9/455* (2006.01)
*G06F 17/50* (2006.01)

(52) U.S. Cl.
USPC .......................................................... 716/111

(58) Field of Classification Search
USPC .......................................................... 716/111
See application file for complete search history.

(56) References Cited

U.S. PATENT DOCUMENTS

2006/0064656 A1* 3/2006 Lakshmanan et al. ............. 716/5
2008/0244483 A1* 10/2008 Chang et al. ...................... 716/5
2013/0111422 A1* 5/2013 Reed et al. ..................... 716/102

* cited by examiner

*Primary Examiner* — Suresh Memula
(74) *Attorney, Agent, or Firm* — Park, Vaughan, Fleming & Dowler, LLP

(57) ABSTRACT

A system, a computer program product, and a computer-implemented method are provided for automatically generating a LVS rule file, and/or for automatically generating a regression test data suite.

21 Claims, 3 Drawing Sheets

COMPUTER-IMPLEMENTED METHODS AND SYSTEMS FOR AUTOMATIC GENERATION OF LAYOUT VERSUS SCHEMATIC (LVS) RULE FILES AND REGRESSION TEST DATA SUITES

TECHNICAL FIELD

Embodiments of the subject matter described herein relate generally to Electronic Design Automation (EDA) software and computer systems that execute the same. More particularly, embodiments of the subject matter relate to computer-implemented methods and systems for automatically generating a layout versus schematic (LVS) rule file, and for automatically generating a regression test data suite that can be used to validate the LVS rule file and to validate subsequent changes to the LVS rule file.

BACKGROUND

Electronic Design Automation (EDA) software refers to a category of software tools used for designing electronic systems such as integrated circuits. Some conventional EDA verification software can include a layout versus schematic (LVS) verification tool. The LVS verification tool uses a LVS rule file to verify layout design data against the schematic design data. More specifically, the LVS verification tool uses a LVS rule file to compare a particular integrated circuit layout against an original schematic (or circuit) diagram of the particular integrated circuit, and determines whether the particular integrated circuit layout corresponds to the original schematic for that particular integrated circuit.

One drawback of current LVS verification systems and software is that the process of generating the LVS rule files is time-consuming and prone to human error. To explain further, the code for the LVS rule file is generated by hand by a human developer (e.g., an engineer). Generating this code is a tedious process that involves the developer reading a design rule manual (DRM) provided from a foundry, and then manually generating the LVS rule file by hand coding. To validate the LVS rule file, the developer hand-generates test structures that are then executed at the LVS verification tool, and the results are interpreted by engineers. This process is not only time consuming, but is subject to errors at each stage of the development process.

Another drawback of current LVS verification systems and software is that there is no easy way of validating subsequent changes to a LVS rule file. There are no reliable and repeatable methods of creating suites of tests to validate subsequent changes to a LVS rule file. Currently, engineers must generate, by hand, the suite of tests used to validate changes to LVS rule files, and this can result in errors being introduced.

In either case, errors in the LVS rule file are difficult to identify, and if not discovered, can cause the LVS verification tool to fail to properly find problems during verification. When this happens the integrated circuits that are manufactured can have errors that render them non-functional. This wastes money and time.

It would be desirable to provide improved EDA software that can be used to reduce the time required to generate LVS rule files. It would also be desirable to provide improved EDA software that can reduce or eliminate human errors that are introduced when generating LVS rule files. It would also be desirable to provide improved EDA software that can quickly validate (or qualify) subsequent changes to LVS rule files. Furthermore, other desirable features and characteristics of the embodiments will become apparent from the subsequent detailed description and the appended claims, taken in conjunction with the accompanying drawings and this background.

The statements in this background section merely provide background information related to the present disclosure. Accordingly, any statements herein are not intended to constitute an admission of prior art.

BRIEF SUMMARY OF EMBODIMENTS

In accordance with some of the disclosed embodiments, a computer-implemented method is provided for automatically generating a LVS rule file. In accordance with the computer-implemented method, a parsing module processes a design rule manual (DRM) document to generate a data structure that corresponds to the DRM document. The data structure that comprises an entry for each particular device. Each entry specifies one or more prohibited layers and one or more required layers for that particular device during manufacture of that particular device. To explain further, the DRM document is a specification that includes information that describes and specifies physical design rules for particular devices that make up an integrated circuit. The information includes truth tables that describe one or more prohibited layers for each particular device, and one or more required layers for each particular device. To generate the data structure, the parsing module is executed at a processor such that it reads text (e.g., from the truth tables) of the DRM document, and extracts particular information from the text to generate extracted information. This extracted information includes a list of all layers of the integrated circuit that is specified by the DRM document, a list of all devices of the integrated circuit that is specified by the DRM document, a list of all prohibited layers for each particular device during manufacture of that particular device, and a list of all required layers for each particular device during manufacture of that particular device. Based on the extracted information, the parsing module generates the entries for each particular device, and stores each of the entries in the data structure that corresponds to the DRM document.

A Layout Versus Schematic (LVS) rule file generator module automatically generates, based on the entries for each particular device in the data structure that corresponds to the DRM document, a LVS rule file. In one embodiment, the LVS rule file generator module receives the data structure from the parsing module, and as it iterates through the data structure, automatically encodes the entry for each particular device into computer executable instructions that comply with a LVS rule file syntax and that are capable of being interpreted by a LVS verification module. The LVS rule file generator module then writes/records the computer executable instructions to the LVS rule file.

The computer executable instructions in the LVS rule file comprise instructions for instructing the LVS verification module on how to interpret and process the LVS rule file. For example, the computer executable instructions instruct the LVS verification module on how to interpret and process graphical layout data in a vector graphics binary file to generate a layout netlist. The computer executable instructions also instruct the LVS verification module on how to interpret and process a schematic netlist that includes a textual representation of a circuit schematic. The computer executable instructions also instruct the LVS verification module on how to compare the layout netlist to the schematic netlist, and how to determine whether the layout netlist matches the schematic netlist.

The LVS verification module can then execute LVS verification processing to generate LVS verification results. The LVS verification results comprise a set of result files, where each result file corresponds to a particular device. The LVS verification results can indicate whether or not each particular device as specified by the graphical layout data matches each particular device as specified by the textual representation according to constraints specified in the LVS rule file. When it is determined that there is not match, wherein the LVS verification results include details regarding where a mismatch exists In accordance with some of the disclosed embodiments, a computer-implemented method is provided for automatically generating a regression test data suite that can be used to validate subsequent changes to the LVS rule file. In accordance with the computer-implemented method, a regression test suite generator module is provided that can automatically generate, based on the entry for each particular device from the data structure that corresponds to the DRM document, a regression test data suite. The regression test data suite includes a valid entry that is unique for each particular device. Each valid entry comprises a set of valid layout data for that particular device when implemented correctly, and a set of valid schematic data for that particular device that includes a correct textual representation of a schematic for that particular device when implemented correctly. The regression test data suite also includes a plurality of invalid entries for each particular device. Each invalid entry includes a set of invalid layout data for that particular device.

The regression test data suite can be automatically generated in a multi-step process as follows.

First, the regression test suite generator module iterates through the entry for each particular device in the data structure of the DRM document. For each particular device, the regression test suite generator module creates the valid entry for that particular device. Then, for each particular device, the LVS verification module can determine whether the set of valid layout data for that particular device matches the set of valid schematic data for that particular device, and when it does, can generate a baseline LVS verification result that indicates that the set of valid layout data for that particular device matches the set of valid schematic data for that particular device. The regression test suite generator module can then generate, for each particular device, a baseline netlist that corresponds to the valid entry for that particular device.

During the next phase, the regression test suite generator module can create, for each particular device, a first set of invalid entries for that particular device. Each of the first set of invalid entries for that particular device is created by adding a prohibited layer to layout data for that particular device to generate a set of invalid layout data for that particular device. For each of the first set of invalid entries for each particular device, the LVS verification module can compare the set of invalid layout data for that particular device to the set of valid schematic data for that particular device, and can generate a LVS verification result that indicates that the set of invalid layout data for that particular device does not match the set of valid schematic data for that particular device. In addition, the regression test suite generator module can create, for each particular device, a second set of invalid entries. Each of the second set of invalid entries for that particular device can be created by removing a required layer for that particular device to generate a set of invalid layout data for that particular device. For each second set of invalid entries for each particular device, the LVS verification module can compare the set of valid layout data for that particular device to the set of valid schematic data for that particular device, and can generate another LVS verification result that indicates that the set of invalid layout data for that particular device does not match the set of valid schematic data for that particular device.

During the next phase, the LVS verification module can compare, for each particular device, the set of valid layout data for that particular device to other baseline netlists for each of the other devices. The LVS verification module can then determine whether the set of valid layout data for that particular device matches any of the other baseline netlists for each one of the other devices. When it is determined that the set of valid layout data for that particular device does not match any of the other baseline netlists for each one of the other devices, verification is successfully completed. However, when there is a match between the set of valid layout data for that particular device and any of the other baseline netlists for each one of the other devices, then verification failed and the reasons why must be determined either by a human or computer program that inspects the LVS verification results.

The computer-implemented methods that are described above for automatically generating a LVS rule file, and/or for automatically generating a regression test data suite can be implemented in a computer program product for use with a computer. The computer program product comprises a non-transitory computer-readable storage medium comprising computer-executable instructions stored thereon for optimizing the number of dies that can be fabricated on the wafer. In such implementations, the computer-executable instructions can perform any combination of the various steps described herein.

The computer-implemented methods and computer program products that are described above can be implemented as part of a system for performing electronic design automation tasks including automatically generating a LVS rule file, and/or automatically generating a regression test data suite. In this case, the system comprises a computer processor, a storage memory coupled to the computer processor, an input apparatus for inputting input variables and a computer program that includes software modules including software modules that are designed to perform the computer-executable instructions that are described above.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Techniques and technologies may be described herein in terms of functional and/or logical block components and with reference to symbolic representations of operations, processing tasks, and functions that may be performed by various computing components or devices. It should be appreciated that the various block components shown in the figures may be realized by any number of hardware, software executed at a processing unit or processor, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

For the sake of brevity, conventional features related to EDA software, and other functional aspects of the devices and systems (and the individual operating components of the devices and systems) may not be described in detail herein. Furthermore, the connecting lines shown in the various figures contained herein are intended to represent example functional relationships and/or physical couplings between the various elements. It should be noted that many alternative or additional functional relationships or physical connections may be present in an embodiment.

Figure 1:
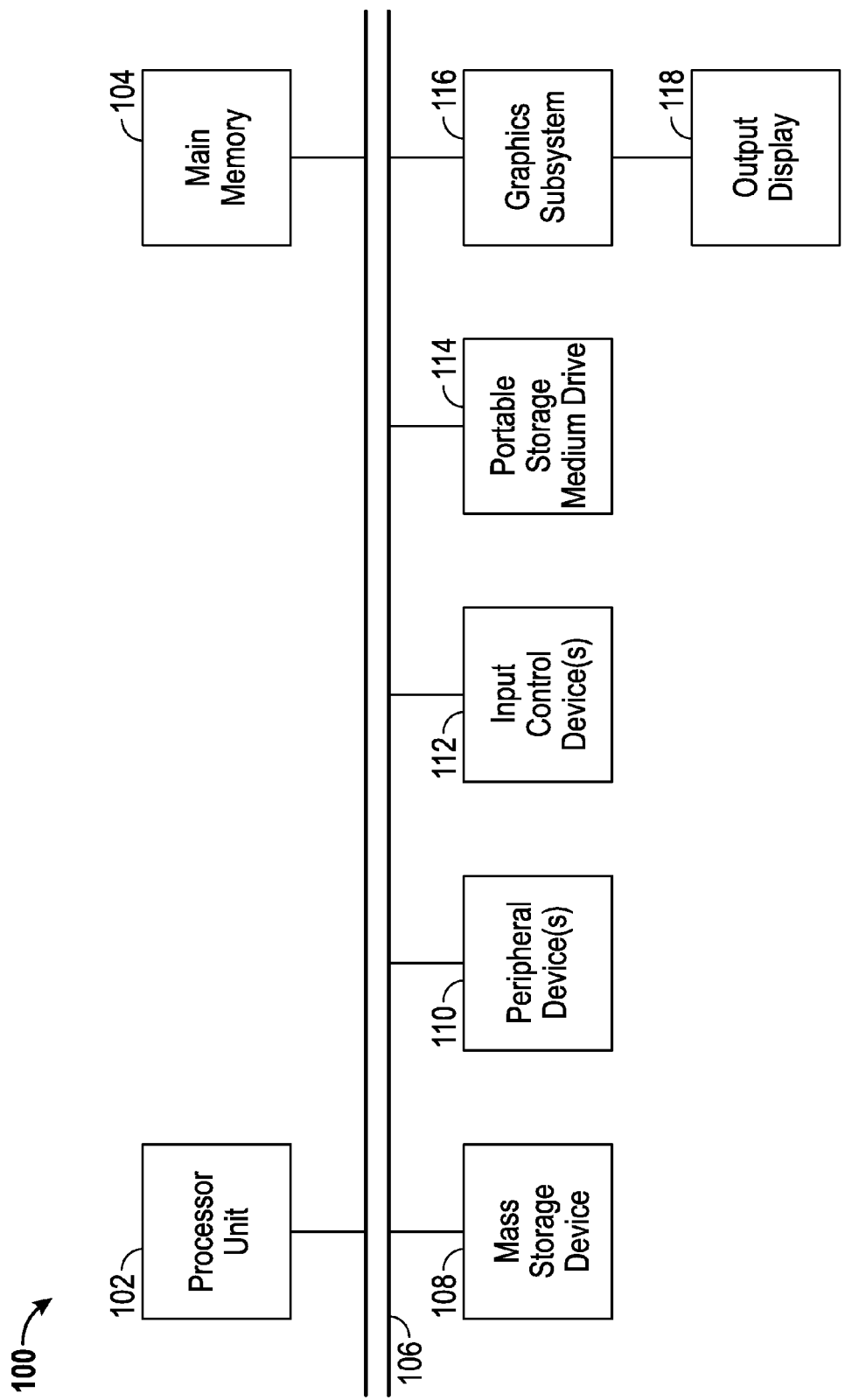
FIG. 1 is a block diagram of a computer system for executing electronic design automation software that can be utilized in accordance with one implementation of the disclosed embodiments.
Figure 2:
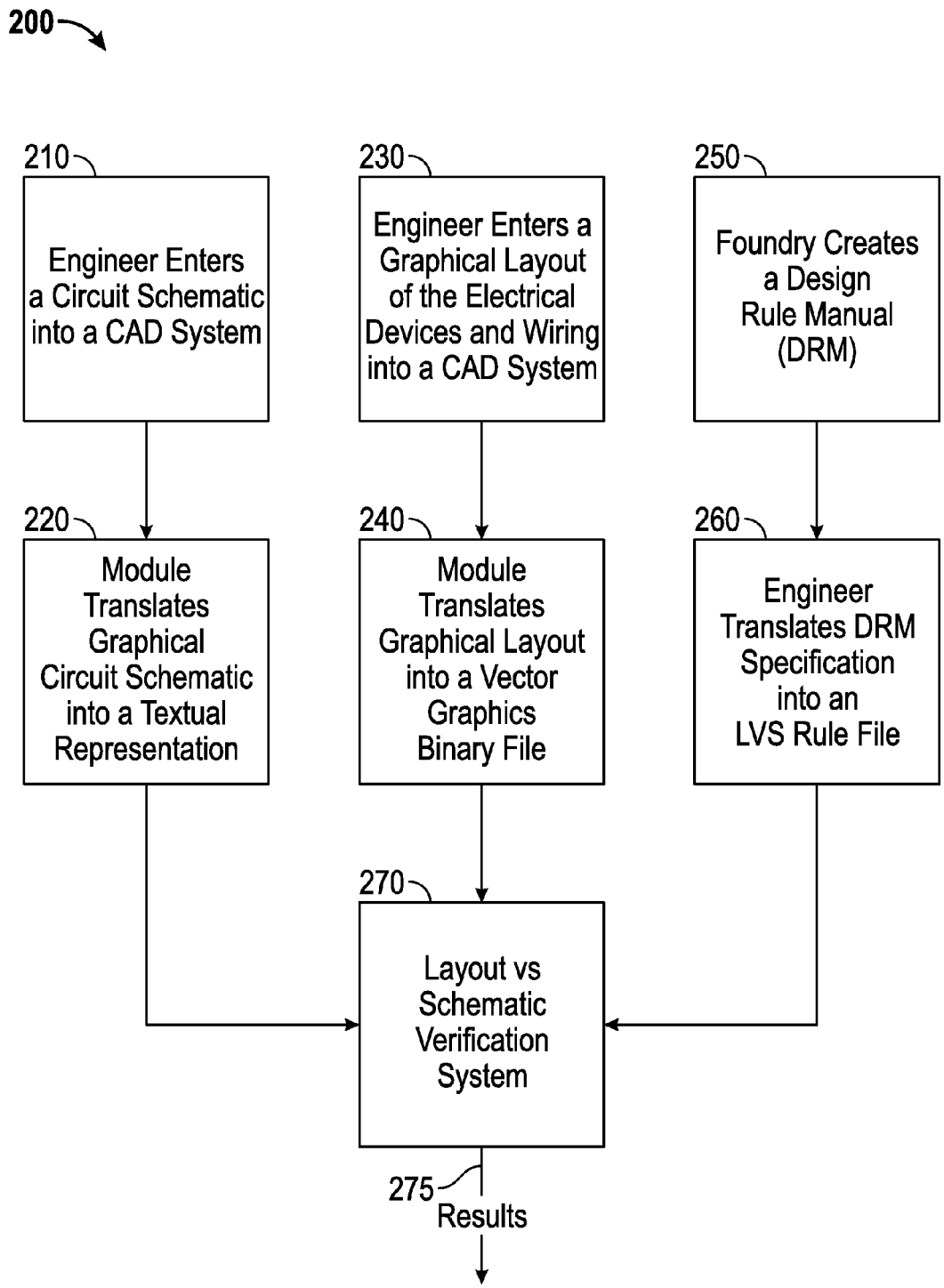
FIG. 2 is a flowchart that illustrates how various inputs to a conventional layout versus schematic (LVS) verification system are generated.
Figure 3:
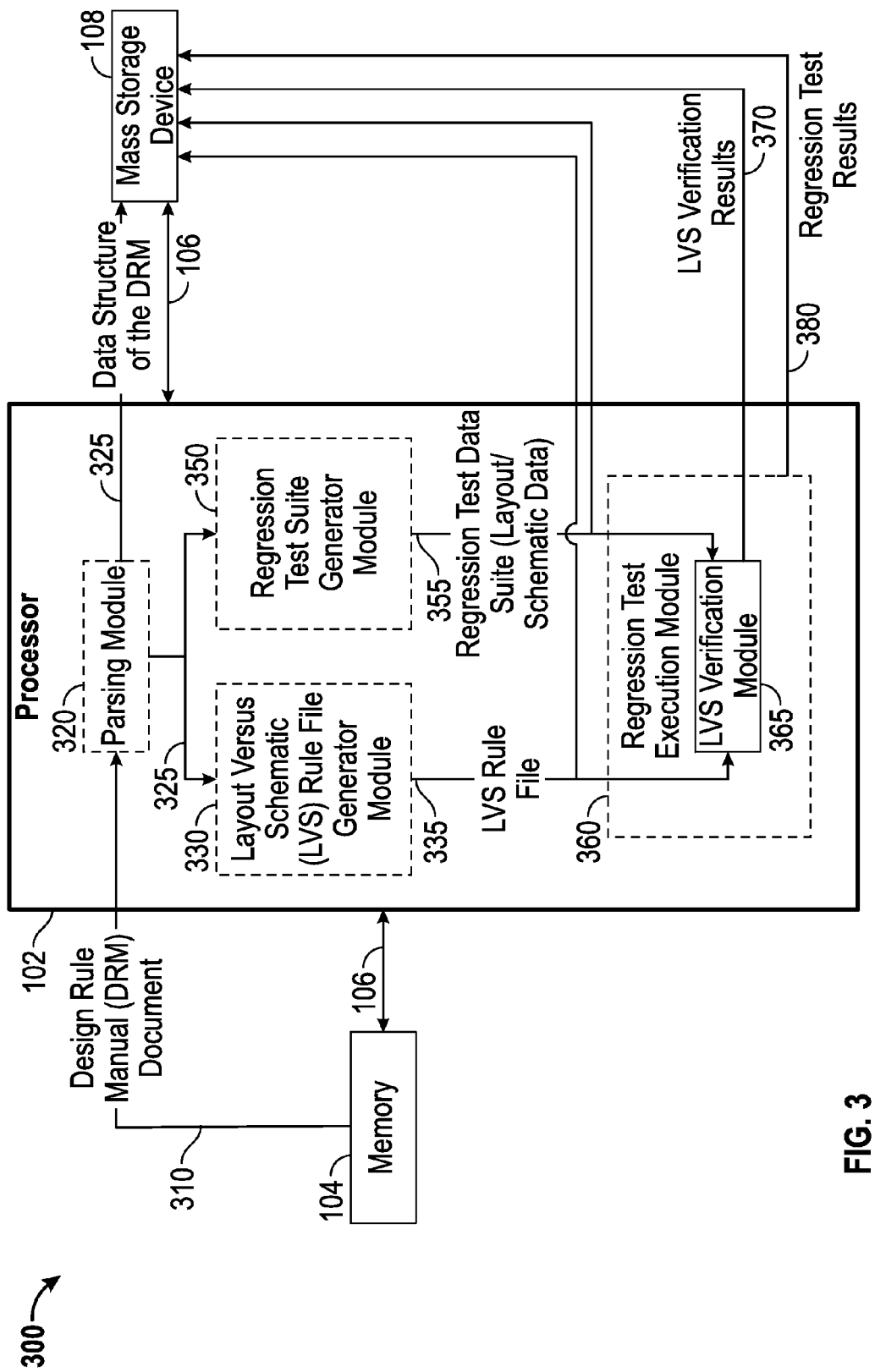
FIG. 3 is a block diagram that illustrates a computer-implemented system in accordance with some of the disclosed embodiments.

Although the embodiments and implementations that will be described below with reference to FIGS. 1-3 are illustrated in terms of functional and/or logical block components (or modules) and various processing steps, it should be appreciated that such block components (or modules) may be realized by any number of hardware, software, and/or firmware components configured to perform the specified functions. As used herein the term "component" or "module" can generally refer to a device, a circuit, an electrical component, and/or a software based component for performing a task. As such, those of skill in the art will appreciate that the various illustrative logical blocks, modules, circuits, and algorithm steps described in connection with the embodiments disclosed herein may be implemented as electronic hardware, computer software, or combinations of both.

For example, the various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC.

One example a computing environment in which the disclosed embodiments may be implemented will now be described below with reference to FIG. 1.

FIG. 1 illustrates a block diagram of a computer system 100 for executing electronic design automation in accordance with various ones of the disclosed embodiments. The computer system 100 includes a processor unit 102, a main memory 104, an interconnect bus 106, a mass storage device 108, peripheral device(s) 110, input control device(s) 112, portable storage drive(s) 114, a graphics subsystem 116, and an output display 118.

Processor unit 102, also referred to herein simply as a processor, may include a single microprocessor or a plurality of microprocessors for configuring computer system 100 as a multi-processor system. In some embodiments, processor unit 102 includes a plurality of processor cores. For example, processor unit 102 may include a plurality of central processing unit cores and/or a plurality of graphics processing unit cores.

Main memory 104 preferably includes banks of dynamic random access memory (DRAM) as well as high-speed cache memory. Main memory 104 stores, in part, instructions and data to be executed by processor 102. For instance, main memory 104 can store EDA software modules, including those that will be described below with reference to FIG. 3, that are comprised of computer executable instructions. Prior to loading in the computer system 100, the EDA software modules may reside as encoded information on a computer-readable tangible medium such as a magnetic floppy disk, a magnetic tape, CD-ROM, DVD-ROM, flash memory, or any other suitable computer readable medium.

For the purpose of simplicity, the components of computer system 100 are connected via interconnect bus 106. However, computer system 100 may be connected through one or more data transport arrangements. For example, processor unit 102 and main memory 104 may be connected via a local microprocessor bus and mass storage device 108, peripheral device(s) 110, portable storage medium drive(s) 114, and graphic subsystem 116 may be connected via one or more input/output (I/O) buses.

Mass storage device 108, which may be implemented with a magnetic disk drive, an optical disk drive, a solid state device, or an attachment to network storage, is non-volatile storage device for storing data, databases, and instructions, to be used by processor unit 102. In one software embodiment, mass storage device 108 may also store the software that is loaded into main memory 104.

Portable storage medium drive 114 operates in conjunction with a portable non-volatile storage medium such as a floppy disk, a compact disk read only memory (CD-ROM), or a digital versatile disk read only memory (DVD-ROM), to input and output data and code to and from the computer system 100. In one embodiment, the software is stored on such a portable medium, and is input to computer system 100 via portable storage medium drive 114.

Peripheral device(s) 110 may include any type of computer support device such as an input/output (I/O) interface, to add additional functionality to computer system 100. For example, peripheral device(s) 110 may include a network interface card to interface computer system 100 to a network.

Input control device(s) 112 provide a portion of the user interface for a computer system 100 user. Input control device(s) 112 may include an alphanumeric keypad for inputting alphanumeric and other key information; and a cursor control device such as a mouse, a track pad or stylus; or cursor direction keys.

In order to display textual and graphical information, computer system 100 contains graphic subsystem 116 and output display(s) 118. Output display 118 may include a cathode ray tube (CRT) display, liquid crystal display (LCD), plasma, or light emitting diode (LED) display, etc.

Graphic subsystem 116 receives textual and graphical information and processes the information for output to display 118.

Prior to describing some of the disclosed embodiments, some terminology and background information about conventional LVS systems will be provided with reference to FIG. 2. FIG. 2 is a flowchart that illustrates how various inputs 220, 240, 260 to a conventional layout versus schematic (LVS) verification system 270 are generated.

Circuit Schematic Data and Schematic Netlist

At 210, an engineer enters a graphical circuit schematic into a Computer Aided Design (CAD) system, and at 220, a software module in the CAD system translates the graphical circuit schematic into a textual representation. As used herein, the term "schematic" refers to a symbolic representation of a semiconductor device circuit or any sub-component of a semiconductor device. The schematic of a semiconductor device is commonly partitioned into a hierarchy of sub-schematics that are used to build the entire device. The symbols are entered into a CAD software system. A textual representation of the circuit schematic is generated from the graphical symbolic representation of the circuit schematic. This textual representation can be referred to as a schematic netlist. The schematic netlist includes information that describes where the type of each particular device and other devices that its' terminals are connected to.

Layout Data

At 230, an engineer enters a graphical layout of the electrical devices and wiring into a CAD system. As used herein, the term "layout" refers to a blueprint of a semiconductor device generated using CAD software. Each schematic has a corresponding layout blueprint that represents the physical implementation of the symbolic circuit schematic which will be used to control the semiconductor fabrication equipment at the foundry to manufacture the semiconductor device. The layout includes polygons which are drawn by layout engineers or generated by automated processes, and text objects that are understood by LVS tools. Polygons are differentiated from one another by being assigned to different lithographic mask layers, also referred to herein simply as layers. The layers are assigned numbers, and each layer's purpose is defined in the Design Rule Manual (DRM) for the given manufacturing process. The text objects name pieces of wiring to indicate where input/output signals interface with the level of hierarchy being drawn. The graphical representation of the blueprint is translated into a vector based image file, also referred to as a vector graphics binary file herein, that lists every layer and the vertices of all of the polygons on that layer.

At 240, a software module in the CAD system translates graphical layout into a vector graphics binary file.

Design Rule Manual and Generation of LVS Rule File

At 250, a foundry creates a design rule manual (DRM). As used herein, the term "design rule manual (DRM)" refers to a file that is created by a semiconductor fabrication facility, also called a foundry, which describes, in detail, every aspect of the process of manufacturing a semiconductor device. For the LVS process, the relevant sections of the DRM list every electrical device that can be manufactured following the manufacturing process in question. Furthermore, for each electrical device, the DRM defines which required layers that are required to properly form the device and how they must relate to one another to properly form the device. The DRM also lists prohibited layers that are forbidden from interacting with the required layers that form a particular device. This DRM serves as a specification document for an engineer that is creating the LVS rule file. At 260, an engineer translates the specification of the DRM into an LVS rule file.

The textual representation (generated at 220), the vector graphics binary file (generated at 240), and the LVS rule file (generated at 260) are then input to the LVS verification system 270.

Extraction

As used herein, the term "LVS verification" refers to a process by which the vector image file representing the layout is compared against the textual representation of the schematic (i.e., the schematic netlist) for which that layout was implemented. Rules that dictate how to read and compare the two files are contained in a file that is commonly called a LVS rule file. As used herein, a "LVS rule file" refers to a data structure that describes layers that make up each particular device of the integrated circuit, connectivity of each layer, and can include connectivity information that describes connections between devices of the integrated circuit. The LVS rule file also includes instructions for performing extraction. LVS extraction is a process that takes place within the LVS verification system 270 in which the vector graphics binary file (from 240) is converted into a textual representation that is called a layout netlist.

Rules in the LVS rule file are implemented as a set of Boolean operations that are executed on the geometries in the vector graphics binary file to determine which electrical devices are present in the layout and how they are electrically connected to each other. For example, the set of Boolean operations specified in the LVS rule (from 260) file allow the LVS verification system 270 to determine (1) what type of device is defined for a combination of layers intersecting at a given point, (2) which layers the terminal(s) of each device are connected to, (3) which layers are interconnection layers (e.g., wiring and vias), (4) how the interconnect layers connect to each other and to terminals of various devices. The number, type and connectivity of every device in the schematic should be identically represented in the layout for verification to be successful.

During the LVS extraction, Boolean operations described in the LVS rule file are performed on a vector graphics binary file to find electrical devices (e.g., transistors, resistors, capacitors, inductors, diodes, bipolar junction devices).

Comparison and Verification

After these devices are located in the layout and specified as a layout netlist, the LVS verification system 270 compares the layout netlist to the schematic netlist to verify a 1:1 correspondence of device types, and then verifies whether the electrical connectivity of the devices matches, and generates verification results 275 to indicate whether or not there is a match between the layout netlist and the schematic netlist.

As described above in the background section, the process of initially generating the LVS rule files is time-consuming and prone to human error at each stage of the development process. In addition, there is no easy way to validate subsequent changes to a LVS rule file. This time consuming endeavor that is also susceptible to errors being introduced. These problems can cause the LVS verification tool to fail during LVS verification, which can be problematic for at least the reasons mentioned above.

As will now be described below, the disclosed embodiments can resolve these issues by providing computer-implemented methods and systems for automatically generating a LVS rule file, and/or for automatically generating a regression test data suite that can be used to validate modifications to the LVS rule file.

FIG. 3 is a block diagram that illustrates a computer-implemented system 300 in accordance with some of the disclosed embodiments. The system 300 includes a processor 102, a main memory 104, and a mass storage device 108.

The main memory 104 (or alternatively the mass storage device 108) stores software modules that include a parsing module 320, a Layout Versus Schematic (LVS) rule file generator module 330, a regression test suite generator module 350, and a regression test execution module 360.

The software modules can be loaded into the processor 102 and executed to generate a LVS rule file 335 that can be utilized at a LVS verification module 360 to generate LVS verification results 370, and to generate a regression test data suite 355 that can be utilized at a regression test execution module 360 to generate regression test results 380.

Further details of the system will now be described with reference to FIG. 3.

Design Rule Manual (DRM) Document

As illustrated in FIG. 3, the system 300 receives, as its input, a DRM document 310.

The DRM document 310 is a specification that describes and specifies physical design rules for particular devices that make up an integrated circuit. As described above, the DRM document 310 is created by a semiconductor device manufacturing facility, or foundry. The DRM document 310 can have any known format so long as it includes information pertaining to layers that are required and prohibited during the manufacture of each electrical device that is specified. The DRM document 310 describes all aspects of the manufacturing process for use by its customers in designing semiconductor devices that will be manufactured in the foundry. The DRM document 310 specifies physical design rules and a list that specifies all of the electrical devices that are available for designers' use when designing the integrated circuit. The DRM document 310 includes truth tables that describe one or more prohibited layers for each particular device, and one or more required layers for each particular device.

Processing of the Design Rule Manual (DRM) Document

The parsing module 320 processes the DRM document 310 to generate a data structure 325 that corresponds to the DRM document 310. The data structure 325 includes an entry for each particular device. Each entry specifies one or more prohibited layers and one or more required layers for that particular device during manufacture of that particular device.

To explain further, to generate the data structure 325, the parsing module 320 is executed at a processor such that it reads text (e.g., from the truth tables) of the DRM document 310, and extracts particular information from the text to generate extracted information. This extracted information includes a list of all layers of the integrated circuit that is specified by the DRM document 310, a list of all devices of the integrated circuit that is specified by the DRM document 310, a list of all prohibited layers for each particular device during manufacture of that particular device, and a list of all required layers for each particular device during manufacture of that particular device. Based on the extracted information, the parsing module 320 generates the entries for each particular device, and stores each of the entries in the data structure 325 that corresponds to the DRM document 310. The resulting data structure 325 can then be stored in a database in computer memory, such as the main memory 104 or the mass storage device 108 of FIG. 3.

Automatic Generation of LVS Rule File

In accordance with the disclosed embodiments, a LVS rule file generator module 330 is provided for automatically generating a LVS rule file 335 based on the entries for each particular device in the data structure 325.

The LVS rule file generator module 330 is a program that receives data structure 325 (e.g., from the parsing module 320 or from memory 104), iterates through the data structure 325 and processes (e.g., automatically translates or encodes) data in the data structure 325.

For instance, as the LVS rule file generator module 330 iterates through the data structure 325, automatically encodes the entry for each particular device into computer executable instructions that comply with a LVS rule file 335 syntax and that are capable of being interpreted by a LVS verification module 365. The LVS rule file generator module 330 then writes/records the computer executable instructions to the LVS rule file 335. In some implementations, the computer executable instructions can be in the format of rule statements that comply with a particular LVS rule file syntax.

The LVS rule file 335 provides a list of layer numbers and their equivalent names, and instructions for extraction (in the form of a listing of Boolean operation steps) that specify how the LVS verification module 365 is to interpret and process the vector graphics binary file that represents the layout to generate a layout netlist (e.g., a textual representation of the vector graphics binary file). In general, the LVS rule file 335 can includes statements that represent each of the electrical devices based on what mask layers are required, statements that specify how electrical devices are to be recognized, and statements that will flag illegally formed devices as errors. This allows the LVS verification module 365 to process the vector graphics binary file and recognize the layout of every electrical device available for manufacture in the given process based on the Boolean operations specified in the LVS rule file 335. For instance, the LVS rule file 335 provides instructions needed to determine, for a combination of layers intersecting at a given point, what type of device this is and what is connected to its terminal(s).

In addition, the LVS rule file 335 provides instructions that specify how the LVS verification module 365 is to compare the layout netlist to the schematic netlist so that the LVS verification module 365 can determine whether the electrical devices and the connections specified in layout netlist and the schematic netlist match. These instructions allow the LVS verification module 365 to verify that the layout (as specified in the layout netlist) is equivalent to the circuit level schematics (as specified in the schematic netlist) from which they are drawn.

In accordance with one implementation of the disclosed embodiments, the computer executable instructions in the LVS rule file 335 include instructions for instructing the LVS verification module 365 on how to interpret and process the LVS rule file 335. For example, the computer executable instructions instruct the LVS verification module 365 on how to interpret and process graphical layout data in a vector graphics binary file to determine where each particular device is specified by the graphical layout data, and encodes the extracted information into a layout netlist. This way, the LVS verification module 365 can process the graphical layout data as specified by the vector graphics binary file by performing Boolean operations described in the LVS rule file 335 to determine combinations of required layers that identify a particular device (e.g., combinations of layers that are valid and thus form legal devices), and to determine other erroneous combinations of layers that include at least one prohibited layer and thereby form an illegal device. In addition, the LVS verification module 365 can also process the vector graphics binary file by performing Boolean operations described in the LVS rule file 335 to determine which required layers make up wiring and how those layers connect to each other and to particular devices. This information is then specified in the layout netlist.

The computer executable instructions also instruct the LVS verification module 365 on how to interpret and process a file that includes a textual representation of a circuit schematic (also referred to as a schematic netlist) to determine where each particular device is specified by the textual representation.

The computer executable instructions also instruct the LVS verification module 365 on how to compare where each particular device is specified by the graphical layout data versus where each particular device is specified by the schematic netlist (i.e., textual representation of the schematic), and how to determine whether each particular device as specified by the graphical layout data matches each particular device as specified by the schematic netlist. For instance, the computer executable instructions can instruct the LVS verification module 365 to compare the layout netlist to the schematic netlist to verify: (1) whether there is a one-to-one correspondence of device types, and (2) whether mask layout sets as specified in the layout netlist are equivalent to circuit level schematics as specified by the schematic netlist from which they are drawn.

In addition, the computer executable instructions also instruct the LVS verification module 365 on how to verify electrical connectivity of the identified devices, and determine whether the various devices as specified in the layout netlist are connected to one another in the same manner as specified in the schematic netlist (e.g., to determine whether each particular device connection as specified by the layout netlist matches each particular device connection as specified by the schematic netlist).

Automating the encoding not only expedites the process of generating the LVS rule file 335 (since it eliminates the need to have a human generate the LVS rule file 335), but also eliminates human error from the coding process.

LVS Verification Processing

The LVS verification module 365 can be any known type of LVS physical verification software that is commercially available from vendors, or proprietary LVS physical verification software that is not commercially available.

Using the LVS rule file 335, the LVS verification module 365 executes LVS verification processing, for example, as described above with respect to FIG. 2, to generate LVS verification results 370. The LVS verification results 370 include a set of result files, where each result file corresponds to a particular device. In some implementations, this set of result files can be used to generate one or more reports that display the results of the LVS verification. The LVS verification results 370 describe whether the layout and schematic match according to the constraints specified in the LVS rule file 335. More specifically, the LVS verification results 370 can indicate whether or not layers and electrical connections for each particular device as specified by the graphical layout data matches layers and electrical connections for each particular device as specified by the textual representation according to constraints specified in the LVS rule file 335. When it is determined that there is not match, the LVS verification results 370 include details regarding where a mismatch exists.

Regression Testing

As used herein, the term "regression testing" refers to methods of testing a system by comparing the outcome produced by the system being tested and a similar system that is known to produce a correct outcome. A regression test verifies that changes made to a system have not caused the system to perform in a way that is a regression from a previous, correct state.

In the context of a LVS verification system, regression testing can be used to validate that subsequent changes to the inputs of the system do not have a negative effect on the results of the system. For instance, regression testing can be used to quickly and accurately qualify various changes to the system such as, for example, (1) to qualify a new software release versions from the vendors of the LVS software or the CAD software used in generating layout and schematics; (2) to qualify changes to the configuration of the LVS software package; (3) to qualify changes to the configuration of the CAD software used to create layout; and (4) to qualify changes to the configuration of the CAD software used to create schematics and generate textual netlists from those schematics.

Automatic Generation of the Regression Test Data Suite

In accordance with some of the disclosed embodiments, to perform these qualifications, a regression test suite generator module 350 is provided. The regression test suite generator module 350 can automatically generate, based on the entry for each particular device from the data structure 325 that corresponds to the DRM document 310, a regression test data suite 355 that specifies different combinations of layout and schematic data.

For example, the regression test data suite 355 includes a valid entry that is unique for each particular device of the integrated circuit. Each valid entry includes a set of valid layout data for that particular device when implemented correctly, and a set of valid schematic data for that particular device that includes a correct textual representation of a schematic for that particular device when implemented correctly. The valid entry for each particular device is unique in that each valid entry includes a different combination of layout data and schematic data that is unique to that particular device.

The regression test data suite 355 also includes a plurality of invalid entries for each particular device. Each invalid entry includes a set of invalid layout data for that particular device (e.g., layout files and schematic netlists that represent all of the possible combinations).

Generation of the Regression Test Data Suite

The regression test suite generator module 350 accesses the data structure 325 of the DRM document, iterates through the data structure 325 and generates the regression test data suite 355. In accordance with some embodiments, the regression test data suite 355 can be automatically generated in a multi-step process as follows.

First, the regression test suite generator module 350 iterates through the entry for each particular device in the data structure 325 of the DRM document 310. For each particular device, the regression test suite generator module 350 creates the valid entry for that particular device. Then, for each particular device, the LVS verification module 365 can determine whether the set of valid layout data for that particular device matches the set of valid schematic data for that particular device, and when it does, can generate a baseline LVS verification result that indicates that the set of valid layout data for that particular device, which can also be referred to as a "layout cell" in some implementations, matches the set of valid schematic data for that particular device. The regression test suite generator module 350 can then generate, for each particular device, a baseline netlist that corresponds to the valid entry for that particular device. Each baseline netlist provides a baseline example of how this particular device should look from a layout and schematic point of view.

During the next phase, the regression test suite generator module 350 can generate invalid layouts for each particular device that are incorrect.

For example, the regression test suite generator module 350 can create, for each particular device, a first set of invalid entries for that particular device. Each of the first set of invalid entries for that particular device is created by adding a prohibited layer to layout data for that particular device to generate a set of invalid layout data for that particular device. The number of invalid entries in each set corresponds to the number of invalid layers for that particular device. For each device, one invalid entry can be generated for each prohibited layer. For each of the first set of invalid entries for each particular device, the LVS verification module 365 can compare the set of invalid layout data for that particular device to the set of valid schematic data for that particular device, and can generate a LVS verification result that indicates that the set of invalid layout data for that particular device does not match the set of valid schematic data for that particular device.

In a similar manner, the regression test suite generator module 350 can create, for each particular device, a second set of invalid entries. Each of the second set of invalid entries for that particular device can be created by removing a required layer for that particular device to generate a set of invalid layout data for that particular device. For each second set of invalid entries for each particular device, the LVS verification module 365 can compare the set of valid layout data for that particular device to the set of valid schematic data for that particular device, and can generate another LVS verification result that indicates that the set of invalid layout data for that particular device does not match the set of valid schematic data for that particular device.

During the next phase, the LVS verification module 365 can compare, for each particular device, the set of valid layout data for that particular device to other baseline netlists for each of the other devices to verify that the layout data for that particular device will not match the baseline netlist of any other device. The LVS verification module 365 can then determine whether the set of valid layout data for that particular device matches any of the other baseline netlists for each one of the other devices. When it is determined that the set of valid layout data for that particular device does not match any of the other baseline netlists for each one of the other devices, verification is successfully completed. However, when there is a match between the set of valid layout data for that particular device and any of the other baseline netlists for each one of the other devices, then verification failed and the reasons why must be determined either by a human or computer program that inspects the LVS verification results 370.

The regression test execution module 360 generates regression test results 380. The regression test results 380 include a set of result files with one result file per LVS job performed. The number of results files will depend on the number of electrical devices available in the manufacturing process, and the number of layers required and prohibited for those devices. These result files can be stored at mass storage device 108 to serve as a baseline for comparison to subsequent runs of the LVS rule file 335 and regression suite generation 355.

Using the Regression Test Data Suite for Validation of Changes to LVS Software, CAD System, and/or DRM Once the regression test data suite 355 has been created (e.g., successfully generated), it can be used to validate changes or modifications to the LVS software (e.g., a new software version release made by the software vendor represented at blocks 210, 230 in FIG. 2), changes to the CAD system (e.g., represented at block 270 in FIG. 2, or at blocks 330 and 365 in FIG. 3), or changes made by a foundry to their DRM (e.g., represented at block 250 in FIG. 2).

For example, it is highly desirable to confirm that a new release version of LVS software from the LVS software vendor produces identical results to those produced by the previous version. To perform this verification, an engineer would use the regression test data suite 355 and LVS rule file 335 and use them as inputs to the new version of their LVS software vendor's LVS software (e.g., represented at block 270 in FIG. 2). If the results of the LVS run with the new software version are identical to the results of the run with the previous software version, it can be concluded with certainty that both versions behave identically. This way, the regression test data suite 355 can be used at the LVS verification module 360 to provide a mechanism to quickly and automatically qualify changes to LVS software, changes to the CAD system, and/or changes made by a foundry to their DRM by testing them against a known set of physical layouts to assure that only intended changes have been made and that no unintended or unexpected consequences will occur as a result of those changes.

For example, changes made by the foundry to their DRM document 310 can be verified using the regression test data suite 355. Foundries regularly make changes to their DRM documents based on learning that they gain from executing their manufacturing process, measuring its success, and finding causes of its failures. To verify that only the changes described by the foundry appear in the new DRM document, the process of creating a LVS rule file 335 and regression test data suite 355 from the previous version of the DRM document 310 can be performed, and the regression test data suite 355 can be stored on disk. A new version of the DRM document 310 can be used to repeat the process, producing a new LVS rule file 335. The new LVS rule file 335 can be used as an input to the Regression Test Execution Module 360 along with the previous regression test data suite 355, which was previously stored on disk. Comparing regression test results 380 from the previous execution of the regression test execution module 360 against the current regression test results 380 should show that changes have been made to the DRM document 310. The foundry will provide a list of changes from a previous version of the DRM document in the new version of the DRM document. The differences in the regression test results 380 using the previous version of the DRM document and the new version of the DRM document should have only those differences listed by the foundry. If other differences are seen, this indicates that the foundry has unintended or undocumented changes in their new version of the DRM document 310, which is undesirable.

Changes to the CAD system can also be validated using the regression test data suite 355. A baseline CAD system that is known to be good can be used to enter circuit schematics (e.g. at block 210 in FIG. 2) and graphical layout (e.g., at block 230 in FIG. 2). Changes can be made to the configuration of either of these which may produce different results at block 220 and/or block 240 in FIG. 2. A baseline regression test data suite can be generated (e.g., at block 355 of FIG. 3) that corresponds to the original configuration of the baseline CAD system. The results of this regression test data suite 380 can be stored on disk. A new regression test data suite 355 can then be generated using a CAD system with a new configuration, and new regression test results 380 can be generated. The new regression test results 380 can be compared against the baseline regression test results 380 which were previously stored on disk. If they are identical, then the changes to the CAD system having the new configuration had no impact on the functionality of the LVS system. If the results differ, an engineer can determine if the difference is intentional or unintentional and make necessary adjustments to the CAD system that has the new configuration to make sure it is consistent with the baseline CAD system.

The embodiments in FIG. 3 are described as a computer-implemented system 300 that includes a computer processor 102, a storage memory 104 coupled to the computer processor 102, an input apparatus for inputting information and a computer program that includes software modules including software modules that are designed to perform the computer-executable instructions that are described above. Such a system may be implemented in any computer based platform known in the art that comprises storage media and one or more processors programmably configured with processor instructions for performing the functions described herein. The steps that are performed in the computer-implemented system 300 of FIG. 3 can also be characterized as steps of a computer-implemented method for automatically generating a LVS rule file, and/or for automatically generating a regression test data suite that can be used to validate subsequent changes to a LVS rule file. At least part of these computer-implemented methods can be implemented in a computer program product for use with a computer. The computer program product comprises a non-transitory computer-readable storage medium comprising computer-executable instructions stored thereon for automatically generating a LVS rule file, and/or for automatically generating a regression test data suite that can be used to validate subsequent changes to a LVS rule file. In such implementations, the computer-executable instructions can perform any combination of the various steps described herein. These computer-implemented methods and computer program products can be implemented as part of a system for performing electronic design automation tasks.

CONCLUSION

The disclosed embodiments provide computer-implemented methods and systems for automatically generating a LVS rule file. A design rule manual (DRM) document is read and parsed or processed to generate a data structure that corresponds to the DRM document. This data structure that corresponds to the DRM document can then be used to generate a LVS rule file for use by a LVS physical verification tool. This saves time in generating the LVS rule file. For instance, in one implementation, the disclosed embodiments can generate a LVS rule file in one to two hours as opposed to one or two weeks that would be required to generate the same LVS rule file by hand coding it. In addition, because the LVS rule file is automatically generated by the computer system, this helps prevent/reduce/eliminate errors in the LVS rule file.

The disclosed embodiments also provide computer-implemented methods and systems for generating a regression test data suite that can be used to validate subsequent changes to the LVS rule file. The data structure that corresponds to the DRM document can be used to generate the regression test data suite. In some embodiments, the regression test data suite can be generated simultaneously while generating the LVS rule file. The regression test data suite can then be used during regression testing to automatically validate subsequent changes to a LVS rule file. The conventional process of generating regression test data structures by hand coding could take three to four weeks, whereas the disclosed embodiments can generate a suite of these regression test data structures in one to two hours.

Using these computer-implemented methods and systems to generate the LVS rule file and regression test data suite reduces and/or eliminates the possibility of human errors and omissions in the resultant data.

In the preceding description, certain terminology may be used for the purpose of reference only, and thus are not intended to be limiting.

For example, terms such as "first," "second," and other such numerical terms referring to elements or features do not imply a sequence or order unless clearly indicated by the context. Such terms may be used solely to distinguish one entity or action from another entity or action without necessarily requiring or implying any actual such relationship or order between such entities or actions. For instance, numerical ordinals such as "first," "second," "third," etc. simply denote different singles of a plurality and do not imply any order or sequence unless specifically defined by the claim language. The sequence of the text in any of the claims does not imply that process steps must be performed in a temporal or logical order according to such sequence unless it is specifically defined by the language of the claim. The process steps may be interchanged in any order without departing from the scope of the disclosed embodiments as long as such an interchange does not contradict the claim language and is not logically nonsensical.

Furthermore, depending on the context, words such as "connect" or "coupled to" used in describing a relationship between different elements do not imply that a direct physical connection must be made between these elements. Elements, modules or other features may be referred to as being "connected" or "coupled" together. As used herein, unless expressly stated otherwise, "coupled" means that one element/module/feature is directly or indirectly joined to (or directly or indirectly communicates with) another element/module/feature, and not necessarily mechanically. Likewise, unless expressly stated otherwise, "connected" means that one element/module/feature is directly joined to (or directly communicates with) another element/module/feature, and not necessarily mechanically. For example, two elements may be connected to each other physically, electronically, logically, or in any other manner, through one or more additional elements While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method, comprising:
   in a processor in a computer, performing operations for:
      processing a design rule manual (DRM) document to generate a data structure that corresponds to the DRM document, wherein the data structure comprises an entry for each particular device, wherein each entry specifies one or more prohibited layers and one or more required layers for that particular device; and
      automatically generating, based on the entries for each particular device in the data structure, a LVS rule file.

2. The method of claim 1, wherein processing the design rule manual (DRM) document to generate the data structure, comprises:
   in the processor, performing operations for a parsing module, the operations comprising:
   reading text of the DRM document;
   extracting particular information from the text to generate extracted information comprising: a list of all layers of an integrated circuit that is specified by the DRM document, a list of all devices of the integrated circuit that are specified by the DRM document, a list of all prohibited layers for each particular device, and a list of all required layers for each particular device;
   generating, based on the extracted information, the entries for each particular device; and
   storing each of the entries in the data structure that corresponds to the DRM document.

3. The method of claim 2, wherein the DRM document comprises information that describes and specifies physical design rules for particular devices of an integrated circuit, wherein the information comprises:
   truth tables that describe one or more prohibited layers for each particular device, and one or more required layers for each particular device.

4. The method of claim 1, wherein automatically generating the LVS rule file, comprises:
   in the processor, performing operations for a Layout Versus Schematic (LVS) rule file generator module, the operations comprising:
   receiving the data structure;
   iterating through the data structure and automatically encoding the entry for each particular device into computer executable instructions that comply with a LVS rule file syntax and that are capable of being interpreted by a LVS verification module; and
   writing the computer executable instructions to the LVS rule file.

5. The method of claim 4, wherein the computer executable instructions in the LVS rule file comprise instructions for instructing the LVS verification module on how to:
   interpret and process graphical layout data in a vector graphics binary file to generate a layout netlist;
   interpret and process a schematic netlist that includes a textual representation of a circuit schematic;
   compare the layout netlist to the schematic netlist; and
   determine whether the layout netlist matches the schematic netlist.

6. The method of claim 4, further comprising:
   in the processor, performing operations for the LVS verification module, the operations comprising:
   executing LVS verification processing to generate LVS verification results, wherein the LVS verification results comprise a set of result files, where each result file corresponds to a particular device.

7. The method of claim 6, wherein executing LVS verification processing, comprises:
   generating LVS verification results that indicate whether or not each particular device as specified by the graphical layout data matches each particular device as specified by the textual representation according to constraints specified in the LVS rule file, when it is determined that there is not match, wherein the LVS verification results include details regarding where a mismatch exists.

8. The method of claim 1, further comprising:
   in the processor, performing operations for a regression test suite generator module, the operations comprising:
   automatically generating, based on the entry for each particular device from the data structure that corresponds to the DRM document, a regression test data suite that comprises:
      a valid entry that is unique for each particular device, wherein each valid entry comprises:
         a set of valid layout data for that particular device when implemented correctly, and
         a set of valid schematic data for that particular device that comprises a correct textual representation of a schematic for that particular device when implemented correctly, and
      a plurality of invalid entries for each particular device, wherein each invalid entry comprises:
         a set of invalid layout data for that particular device.

9. The method of claim 8, wherein automatically generating the regression test data suite, comprises:
   receiving the data structure of the DRM document, iterating through the entry for each particular device in the data structure of the DRM document; and for each particular device: creating the valid entry for that particular device;
   for each particular device: generating a baseline netlist that corresponds to the valid entry for that particular device.

10. The method of claim 9, wherein automatically generating the regression test data suite, further comprises:
    for each particular device: creating a first set of invalid entries, wherein each of the first set of invalid entries for that particular device is created by adding a prohibited layer to layout data for that particular device to generate the first set of invalid layout data for that particular device.

11. The method of claim 10, wherein automatically generating the regression test data suite, further comprises:
    for each particular device: creating a second set of invalid entries, wherein each of the second set of invalid entries for that particular device is created by removing a required layer for that particular device to generate the second set of invalid layout data for that particular device.

12. The method of claim 11, further comprising:
    in the processor, performing operations for the LVS verification module, the operations comprising:
    for each particular device:
       comparing the set of valid layout data for that particular device to other baseline netlists for each of the other devices; and
       determining whether the set of valid layout data for that particular device matches any of the other baseline netlists for each one of the other devices; and
       successfully completing verification when it is determined that the set of valid layout data for that particular device does not match any of the other baseline netlists for each one of the other devices.

13. A computer program product for use with a computer, the computer program product comprising a non-transitory computer-readable storage medium comprising computer-executable instructions stored thereon, the computer-executable instructions performing steps comprising:
processing a design rule manual (DRM) document to generate a data structure that corresponds to the DRM document, wherein the data structure comprises: a list of all layers of an integrated circuit that is specified by the DRM document, a list of all devices of the integrated circuit that are specified by the DRM document, and an entry for each particular device, wherein each entry specifies a list of all prohibited layers for each particular device, and a list of all required layers for each particular device; and
automatically generating, based on the entries for each particular device in the data structure, a Layout Versus Schematic (LVS) rule file.

14. The computer program product of claim 13, wherein the step of automatically generating the LVS rule file, comprises:
receiving the data structure;
iterating through the data structure and automatically encoding the entry for each particular device into computer executable instructions that comply with a LVS rule file syntax and that are capable of being interpreted by a LVS verification module, wherein the computer executable instructions comprise instructions on how to: interpret and process graphical layout data in a vector graphics binary file to generate a layout netlist; interpret and process a schematic netlist that includes a textual representation of a circuit schematic; compare the layout netlist to the schematic netlist; and determine whether the layout netlist matches the schematic netlist; and
writing the computer executable instructions to the LVS rule file.

15. The computer program product of claim 13, wherein the computer-executable instructions perform steps further comprising:
automatically generating, based on the entry for each particular device from the data structure that corresponds to the DRM document, a regression test data suite that comprises:
a valid entry that is unique for each particular device, wherein each valid entry comprises:
a set of valid layout data for that particular device when implemented correctly, and
a set of valid schematic data for that particular device that comprises a correct textual representation of a schematic for that particular device when implemented correctly, and
a plurality of invalid entries for each particular device, wherein each invalid entry comprises:
a set of invalid layout data for that particular device.

16. The computer program product of claim 15, wherein the automatically generating, based on the entry for each particular device from the data structure that corresponds to the DRM document, the regression test data suite, comprises:
generating, for each particular device, a baseline netlist that corresponds to the valid entry for that particular device;
creating a first set of invalid entries, for each particular device, by adding a prohibited layer to layout data for that particular device to generate the first set of invalid layout data for that particular device;
creating, for each particular device, a second set of invalid entries for that particular device by removing a required layer for that particular device to generate the second set of invalid layout data for that particular device.

17. A system for performing electronic design automation tasks, the system comprising:
a computer processor;
a storage memory coupled to said computer processor;
an input apparatus for inputting a design rule manual (DRM) document; and
a computer program configured to include software modules including:
a parsing module configured to processes the DRM document to generate a data structure that comprises: a list of all layers of an integrated circuit that is specified by the DRM document, a list of all devices of the integrated circuit that are specified by the DRM document, and an entry for each particular device, wherein each entry specifies a list of all prohibited layers for each particular device, and a list of all required layers for each particular device; and
a Layout Versus Schematic (LVS) rule file generator module configured to automatically generate, based on the entries for each particular device in the data structure, a LVS rule file.

18. The system of claim 17, wherein the LVS rule file generator module is further configured to iterate through the data structure and automatically encode the entry for each particular device into computer executable instructions that comply with a LVS rule file syntax and that are capable of being interpreted by a LVS verification module, and to write the computer executable instructions to the LVS rule file.

19. The system of claim 18, wherein the computer executable instructions comprise instructions on how to instruct the LVS verification module: interpret and process graphical layout data in a vector graphics binary file to generate a layout netlist; interpret and process a schematic netlist that includes a textual representation of a circuit schematic; compare the layout netlist to the schematic netlist; and determine whether the layout netlist matches the schematic netlist.

20. The system of claim 17, the software modules further comprising:
a regression test suite generator module configured to automatically generate, based on the entry for each particular device from the data structure that corresponds to the DRM document, a regression test data suite that comprises:
a valid entry that is unique for each particular device, wherein each valid entry comprises: a set of valid layout data for that particular device when implemented correctly, and a set of valid schematic data for that particular device that comprises a correct textual representation of a schematic for that particular device when implemented correctly, and
a plurality of invalid entries for each particular device, wherein each invalid entry comprises: a set of invalid layout data for that particular device.

21. The system of claim 20, wherein the regression test suite generator module is further configured to, for each particular device, generate a baseline netlist that corresponds to the valid entry for that particular device, create a first set of invalid entries by adding a prohibited layer to layout data for that particular device to generate the first set of invalid layout data for that particular device, and create a second set of invalid entries for that particular device by removing a required layer for that particular device to generate the second set of invalid layout data for that particular device.

* * * * *